(12) United States Patent
Eguchi et al.

(10) Patent No.: US 7,865,797 B2
(45) Date of Patent: Jan. 4, 2011

(54) MEMORY DEVICE WITH ADJUSTABLE READ REFERENCE BASED ON ECC AND METHOD THEREOF

(75) Inventors: Richard K. Eguchi, Austin, TX (US); Ronald J. Syzdek, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 1062 days.

(21) Appl. No.: 11/560,533

(22) Filed: Nov. 16, 2006

(65) Prior Publication Data
US 2008/0120526 A1 May 22, 2008

(51) Int. Cl.
*H03M 13/00* (2006.01)
(52) U.S. Cl. .................... 714/752; 714/763
(58) Field of Classification Search .......... 714/752
See application file for complete search history.

(56) References Cited

U.S. PATENT DOCUMENTS

| | | | |
|---|---|---|---|
| 5,386,388 A | 1/1995 | Atwood et al. | |
| 6,163,481 A | 12/2000 | Yamada et al. | |
| 6,678,192 B2 | 1/2004 | Gongwer et al. | |
| 6,735,114 B1 | 5/2004 | Hamilton et al. | |
| 6,906,951 B2 | 6/2005 | Wong | |
| 2004/0205440 A1* | 10/2004 | Kojima | 714/752 |
| 2005/0007834 A1 | 1/2005 | Hidaka | |
| 2007/0030729 A1 | 2/2007 | Chan et al. | |

OTHER PUBLICATIONS

Polansky et al., "A 4b/cell NROM 1Gb Data-Storage Memory," Saifun Semiconductors, Netanya, Isreal, Macroniz, Hsinchu, Taiwan, ISSCC 2006, 4 pages.
Actions on the Merits by the U.S.P.T.O. as of Apr. 21, 2008, 1 page.
Sit, et al., "A Four-Phase Handshaking Asynchronous Static RAM Design for Self-Timed Systems," IEEE Journal of Solid-State Circuits, vol. 34, No. 1, Jan. 1999, pp. 90-96.

\* cited by examiner

*Primary Examiner*—Scott T Baderman
*Assistant Examiner*—Enam Ahmed

(57) ABSTRACT

A first value from a set of bit cells of a sector of a non-volatile memory device is sensed based on a first read reference. A second value from the set of bit cells is sensed based on a second read reference different than the first read reference. A third read reference for a first subsequent access to the sector of the non-volatile memory device is determined based on at least one of the first read reference and the second read reference in response to determining a first error code condition associated with the first value and a second error code condition associated with the second value represent different error code conditions.

20 Claims, 5 Drawing Sheets

MEMORY DEVICE WITH ADJUSTABLE READ REFERENCE BASED ON ECC AND METHOD THEREOF

CROSS-REFERENCE TO RELATED APPLICATION

The present application is related to U.S. patent application Ser. No. 11/560,554 entitled "MEMORY DEVICE WITH RETAINED INDICATOR OF READ REFERENCE LEVEL" and filed on even date herewith, the entirety of which is incorporated by reference herein.

FIELD OF THE DISCLOSURE

The present disclosure relates generally to memory devices and more particularly to read accesses to non-volatile memory devices.

BACKGROUND

Non-volatile memory (NVM) devices typically are composed of a matrix of bit cells, with each bit cell storing a corresponding bit of data. Each bit cell generally is configured as one or more transistors capable of storing electrons as charge, and thereby affecting the relationship between the control electrode voltage and the drain current of the transistor. The transistor is "erased" to one state (e.g., a logic "1") by clearing the charge and the transistor is "programmed" to another state (e.g., a logic "0") by storing charge at the transistor. Thus, the bit value "stored" by the transistor can be sensed by comparing a reference (either a current or a voltage) to the drain current of the transistor in response to the application of a read voltage to the control electrode of the transistor, whereby the "stored" value is determined to be one state (e.g., a logic "1" or an "erased" state) if the drain current is greater than the read reference and determined to be another state (e.g., a logic "0" or a "programmed" state) if the drain current is less than the read reference.

Some NVM architectures utilize an insulating element, such as a thin film nitride layer or a nanocrystal layer, at the transistor. These architectures typically offer reduced production costs compared to other types architectures due to reduced silicon area, fewer processing steps and generally higher yields. However, for many thin film architectures and similar architectures, the insulating element exhibits a "trap-up" characteristic over numerous program/erase cycles whereby the insulating element becomes saturated with charge, thereby increasing the threshold voltage ($V_t$) of the bit cell and consequently decreasing the drain current of the bit cell in response to the same control electrode voltage. Accordingly, if a fixed read reference is used, increasing trap-up of the bit cell eventually will cause an erroneous read of the bit cell due to the decreasing drain current in comparison to the fixed read reference. In many applications, this erroneous read is unacceptable.

Conventional read reference adjustment techniques have been developed to attempt to overcome the trap-up characteristics of NVM bit cells. One conventional technique includes the use of a reference transistor that is used to generate the read reference based on the assumption that the reference transistor will exhibit the same trap up characteristics as the bit cell. This approach typically entails subjecting the reference transistor to the same program/erase cycles in accordance with the bit cells it is attempting to emulate. Another conventional technique uses a fixed reference current. In this approach, design considerations must be made to account for end-of-life cell characteristics that force a larger operating window at beginning-of-life, increase power consumption, as well as force non-optimum design choices. Accordingly, an improved technique for adjusting the read reference for a NVM device would be advantageous.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

Figure 1:
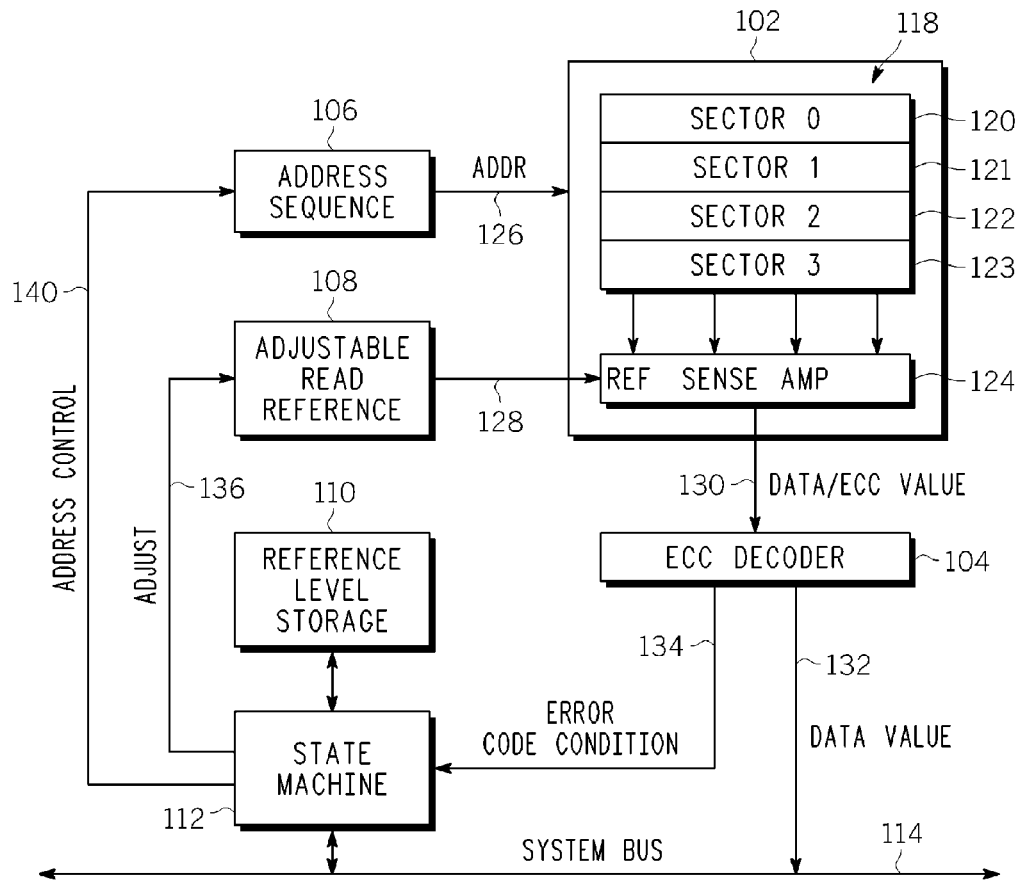
FIG. 1 is a block diagram illustrating a non-volatile memory device having an adjustable read reference in accordance with at least one embodiment of the present disclosure.

In accordance with one aspect of the present disclosure, a method includes sensing a first value from a first set of bit cells of a sector of a non-volatile memory device based on a first read reference, and sensing a second value from the first set of bit cells based on a second read reference different than the first read reference. The method further includes determining a third read reference for a first subsequent access to the sector of the non-volatile memory device based on at least one of the first read reference and the second read reference in response to determining a first error code condition associated with the first value and a second error code condition associated with the second value represent different error code conditions.

In accordance with another aspect of the present disclosure, a method includes for each set of bit cells of a plurality of sets of bit cells of a sector of a non-volatile memory device: adjusting a read reference level and sensing a value of the set of bit cells based on the adjusted read reference level until a change in an error code condition of the set of bit cells is detected; and identifying a read reference level at which the change in the error code condition was detected as a representative read reference for the set of bit cells. The method further includes determining a first read reference for a first subsequent access to the sector based on the representative read references for the plurality of sets of bit cells.

In accordance with yet another aspect of the present disclosure, a device includes a non-volatile memory array including a plurality of sectors. Each sector has a plurality of sets of bit cells. The device further includes a read reference generator having an output to provide an adjustable read reference and a sense amplifier module. The sense amplifier module includes an input selectively connected to a select set of bit cells of a select sector of the non-volatile memory array, an input connected to the output of the read reference generator, and an output to provide a sensed value from the select set of bit cells based on the adjustable read reference. The device further includes an error correcting code (ECC) module having an input connected to the output of the sense amplifier module and an output to provide an error code condition based on the sensed value, and a state machine having an input connected to the output of the ECC module, a control output connected to the read reference generator. The state machine is configured to determine a read reference for a subsequent access to the select sector of the non-volatile memory array in response to a change in the error code condition output by the ECC module resulting from a change in the adjustable read reference.

FIGS. 1-8 illustrate techniques for configuring the read reference of a sector of a non-volatile memory (NVM) array of a NVM device based on changes in the error code condition between the sensing of a memory location of the sector using different read reference levels. In one embodiment, the read reference for a sector is determined in response to a program operation or an erase operation (referred to herein in the alternate as "program/erase operation") by incrementally adjusting the level of a read reference and using the adjusted read reference to sense a bit sequence from a memory location of the sector until a change in the error code condition of the sensed bit sequence from the memory location changes from one read reference level to the next. The read reference at the time of the change in the error code condition is identified as the representative read reference for the memory location. This process can be repeated for a sampling of one or more memory locations of the sector to determine a set of representative read references for the sector. The read reference for the sector then can be determined based on the set of representative read references of the memory locations of the sample set. Accordingly, an ECC component of the NVM device can be utilized both for detection of error code conditions during normal access operations and for use in determining an appropriate read reference for a sector during a configuration operations.

The term "read reference," as used herein, refers to either a read reference voltage or a read reference current, depending on implementation. The term "sector," as used herein, refers to an individually programmable/erasable unit of a memory array. The term "memory location," as used herein, refers to an individually addressable set of bits of a memory array. A sector includes one or more memory locations.

FIG. 1 illustrates a non-volatile memory (NVM) device 100 in accordance with at least one embodiment of the present disclosure. The NVM device 100 can be implemented as one or more separate integrated circuits (ICs), such as in an application specific integrated circuit (ASIC). Alternately, the NVM device 100 can be implemented in another device, such as, for example, a microprocessor or microcontroller implemented as a system-on-a-chip (SOC). In the depicted example, the NVM device 100 includes a NVM array 102, an ECC decoder 104, an address sequencer 106, an adjustable read reference generator 108, a read reference level storage 110, a state machine 112, and a bus 114 (e.g., a system bus). The NVM array 102 includes a bit cell matrix 118 comprising a plurality of bit cells organized as a plurality of sectors (e.g., sectors 120, 121, 122, and 123, hereinafter "sectors 120-123"), and a sense amplifier module 124. The NVM array 102 can include any of a variety of non-volatile memory architectures, such as, for example, a thin-film storage (TFS) architecture, high K dielectric or nanocrystal architectures, nitride-based architectures, resistive memory-based architectures, magnetic random access memory (MRAM) architectures, and the like. The read reference level storage 110, in one embodiment, includes non-volatile memory, such as a test block for the NVM array 102 or a set of memory locations of the NVM array 102.

The NVM array 102 is configured to access a memory location of one of the sectors 120-123 based on a supplied address (ADDR signal 126). In at least one embodiment, each memory location includes a data field to store a data value and an ECC field to store ECC data (e.g., parity data) for the stored data value for the purpose of detecting and/or correcting errors in the stored data value. The sense amplifier module 124 is configured to sense the bit values stored in the set of bit cells at the accessed memory location based on a supplied read reference (read reference 128) and provide the sensed bit values at the memory location as a data/ECC value 130.

The ECC decoder 104 is configured to receive the data/ECC value 130, perform one or more ECC operations using the data value and the ECC value represented by the data/ECC value 130 to detect and/or correct errors in the data value, if correctable, and output a resulting data value 132, as well as provide an error code condition indicator 134 indicating the error code condition of the sensed data/ECC value 130. Possible error code conditions can include, for example, a "no error detected" condition that indicates that the data value 132 is valid data, and an "error detected" condition indicating that at least one error was detected. The "error detected" condition further can be identified as an "error detected-corrected" condition that indicates that a bit error was detected and corrected and the data value 132 is valid data or as an "error detected-not corrected" condition that indicates that a bit error was detected but could not be corrected and thus the data value 132 is not valid data. Depending on the ECC algorithm utilized to detect errors, single bit errors typically can be corrected and therefore are likely to result in the "error detected-corrected" condition, whereas multiple bit errors typically are not correctable and therefore are likely to result in the "error detected-not corrected" condition.

The adjustable read reference generator 108 is configured to provide the read reference 128, whereby the adjustable read reference generator 108 can adjust the level (i.e., the voltage or current) provided as the read reference 128 based on an adjust signal 136. The adjustable read reference generator 108 can be implemented as, for example, a current mirror having an output configured to provide the read reference 128 and an input connected to a plurality of current sources in parallel, whereby the current sources are individually activated or deactivated based on the adjust signal 136. To illustrate, the adjustable read reference generator 108 can include five 2 microamp (uA) current sources individually activated or deactivated to provide an aggregate current between 0 uA and 10 uA and thus the read reference for each sector can be set at one of 0 uA, 2 uA, 4 uA, 6 uA, 8 uA, or 10 uA. Other configurations of the adjustable read reference generator 108 may be utilized as appropriate without departing from the scope of the present disclosure.

In operation, memory events are received from another device (e.g., from a memory controller) via the bus 114, where the memory events can include, for example, reset operations, read access operations, erase operations, program operations, and the like. In response to an program/erase operation for one of the sectors, the state machine 112 determines the read reference for subsequent read accesses to the sector based on the error code condition indicator 134 of the ECC decoder 104 and stores an indicator of the determined read reference in the read reference level storage 110. In response to a reset event, such as a "soft" reset or a power-down/power-up cycle of the NVM device 100, the state machine 112 determines the read reference for some or all of the sectors of the NVM array 102 using the error code condition indicator 134. Alternately, in response to a reset event, the state machine 112 loads the read reference indicators from the read reference level storage 110 to a temporary volatile memory (e.g., a register file) for rapid access. In response to a read access to a sector, the state machine 112 accesses the read reference indicator for the sector from the read reference level storage 110 (or alternately, from a temporary storage location) and configures the adjustable reference generator 108 to output a level for the read reference 128 that is substantially equivalent to the read reference indicated by the accessed read reference indicator.

It will be appreciated that the particular bit sequence sensed by the sense amplifier module 124 for a particular memory location of the NVM array 102 is based on the relationship between the drain currents of the bit cells at the memory location and the level for the read reference 128 used by the sense amplifier module 124 as one or more of the bit cells may be sensed as having different bit values for different levels of the read reference 128. Further, it will be appreciated the change in value at one or more bit positions of the bit sequence provided to the ECC decoder 104 typically will result in a change in the error code condition indicated by the ECC decoder 104 for the memory location. Accordingly, in one embodiment, the state machine 112 utilizes a change in the error code condition between successive read accesses to the same memory location using different levels for the read reference 128 to identify the representative read reference for the memory location. For a given memory location of a sector, the state machine 112 configures the adjustable read reference generator 108 using the adjust signal 136 to output an initial level for the read reference 128. The sense amplifier module 124 then senses the bit cells of the memory location using the initial level for the read reference 128 and provides the sensed bit sequence to the ECC decoder 104 for ECC processing. An indicator of the error code condition resulting from the ECC processing is stored by the state machine 1 12. The level of the read reference 128 then is incrementally adjusted, the memory location sensed using the adjusted read reference 128, and the resulting sensed bit sequence processed by the ECC decoder 104 to determine its error code condition until the error code condition for the memory location changes. The level of the read reference 128 resulting in the change in the error code condition (i.e., either the level of the read reference 128 before the change or the level of the read reference 128 causing the change) is identified by the state machine 112 as the representative read reference for the memory location and the state machine 112 can set the read reference for the sector based on the representative read reference for the memory location.

In certain implementations, the programming process for the NVM 102 is configured so that all of the bit cells of a memory location are not permitted to have a "programmed" state at any given time; that is, at least one bit cell of a memory location remains in an "erased" state at any given time, whereby the erased bit cell can be an ECC bit cell or a data bit cell. Accordingly, in this instance, it will be appreciated that the representative read reference identified for a memory location can represent the voltage threshold $V_t$ of the least erased bit cell (LEB) of the set of bit cells representing the memory location and thus the representative read reference represents the maximum read reference level for which the erased bit cells of the memory location are expected to be reliably sensed. Alternately, the representative read reference identified for a memory location can represent the voltage threshold $V_t$ of the least programmed bit cell (LPB) of the set of bit cells representing the memory location and thus the representative read reference represents the minimum read reference level for which the programmed bit cells of the memory location are expected to be reliably sensed.

In one embodiment, the read reference 128 is initially set to a relatively high level such that at least one of the bit cells of the memory location are likely to be improperly sensed, thereby resulting in the ECC decoder 104 indicating the "error detected" condition for the bit sequence sensed from the memory location by the sense amplifier module 124 using the relatively high level read reference. The read reference 128 then is decremented (e.g., by 2 uA decrements) and the memory location is again accessed, this time using the decremented read reference 128. In the event that the decremented read reference 128 is still to high to reliably read the correct state for each bit cell of the memory location, the ECC decoder 104 likely will continue to identify the sensed bit sequence as having an "error detected" condition and the state machine 112 accordingly decrements the read reference 128 further and repeats the access to the memory location using the read reference 128. When the read reference 128 is decremented to the point that the resulting error code condition changes to an "no error detected" condition, the state machine 112 terminates the scan of the memory location and identifies as the representative read reference for the memory location as either the level of the read reference 128 at the access cycle for which the error code condition changed to a "no error detected" condition or, alternately, the preceding access cycle.

In an alternate embodiment, the read reference 128 is set to a relatively low reference current such that the bit sequence sensed at the memory location is likely to result in a "no error detected" condition and the cycle of incrementing the read reference 128, using the incremented read reference 128 to sense a bit sequence from the memory location, and determining the error code condition of the sensed bit sequence is repeated until the error code condition of the memory location changes from a "no error detected" to an "error detected" condition. When the read reference 128 is incremented to the point that the resulting error code condition changes to an "error detected" condition, the state machine 112 terminates the scan of the memory location and identifies as the representative read reference for the memory location as either the level of the read reference 128 at the access cycle for which the error code condition changed to an "error detected" condition or, alternately, the preceding access cycle.

It will be appreciated that some bit cells of the NVM array 102 (FIG. 1) may be non-operational for any of a variety of reasons and therefore may result in the erroneous sensing of a bit value regardless of the level of the read reference 128. Accordingly, to avoid the situation whereby the read reference for a sector is changed due to the bit error caused by a non-operational bit cell, the state machine 112 determines the representative read reference for a memory location based on multiple-bit error code conditions (e.g., an "error detected-not corrected" condition) as it is unlikely that any given memory location contains more than one non-operational bit cell. To illustrate, for an initial error code condition of "no error detected," the state machine 112 may wait until the incremental adjustment of the read reference 128 causes an "error detected-not corrected" condition to set the representative reference level for the memory location. Conversely, for an initial error code condition of "error detected-not corrected" condition, the state machine 112 may wait until the incremental adjustment of the read reference 128 causes a "no error detected" condition to set the representative reference level for the memory location. Alternately, the state machine 112 may utilize the change from an "error detected-corrected" condition to an "error detected-not corrected" condition or the change from an "error detected-not corrected" condition to an "error detected-corrected" condition for determining the representative read reference for the memory location.

Rather than basing the read reference for a sector on the basis of only one memory location, in an alternate embodiment, the read reference for a sector is based on the representative read references from two or more memory locations selected from the sector as a sample set. In this instance, the address sequencer 106 can be initially configured with the addresses of the memory locations of the sample set using, for example, a table or a linked list. In response to an address control signal 140 provided by the state machine 112, the address sequencer 106 selects the next memory location of the sample set and configures the ADDR signal 126 for the selected memory location so as to initiate access to the memory location in the corresponding sector of the NVM array 102. The state machine 112 determines the representative read reference for each memory location of the sample set by repeatedly performing the adjust read reference-sense bit sequence-determine error code condition cycle until the predetermined error code condition change is observed, as discussed above. The state machine 112 then determines an overall read reference for the sector using the representative read references determined for the memory locations of the sample set. To illustrate, state machine 112 can identify the lowest of the representative read references and offset the read reference for the sector from the lowest of the representative read references by a predetermined offset. As another example, the state machine 112 alternately can average the representative read references and determine the read reference for the sector as an offset from the average representative read reference. One embodiment of the incremental read reference adjustment process is illustrated in greater detail herein with reference to FIG. 5.

Figure 2:
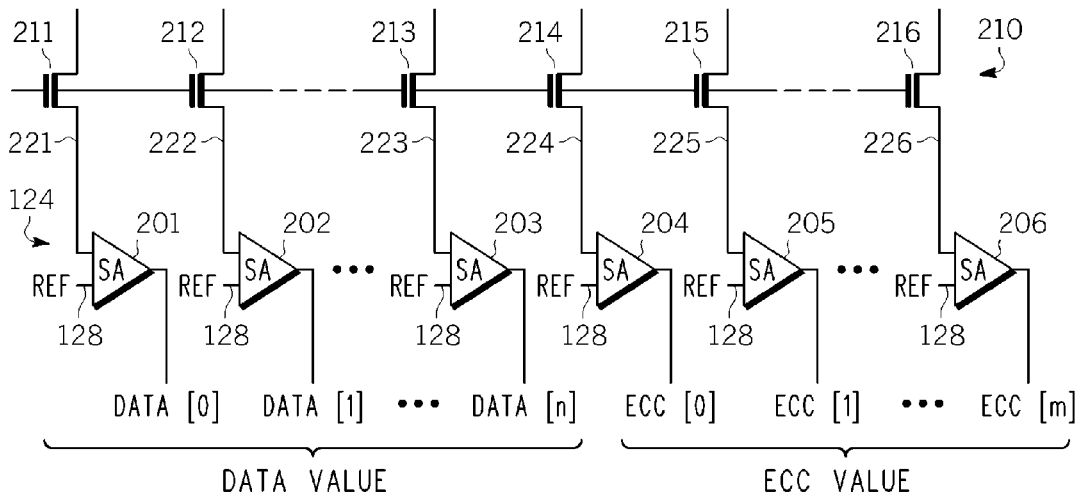
FIG. 2 is a circuit diagram illustrating an implementation of a sense amplifier module of FIG. 1 in accordance with at least one embodiment of the present disclosure.

FIG. 2 illustrates an implementation of the sense amplifier module 124 of FIG. 1 in accordance with at least one embodiment of the present disclosure. In the depicted example, the sense amplifier module 124 includes a plurality of sense amplifiers, including sense amplifiers 201, 202, 203, 204, 205, and 206 (hereinafter, "sense amplifiers 201-206"). Each sense amplifier includes an input to receive the read reference 128 and an input selectively coupleable to a corresponding bit cell of a memory location 210 of a sector of the NVM array 102 (FIG. 1) via a corresponding bit line of a plurality of bit lines (including bit lines 221, 222, 223, 224, 225, and 226). The memory location 210 includes a set of bit cells, including bit cells 211, 212, 213, 214, 215, and 216, wherein each bit cell of one subset of the bit cells is used to store a corresponding bit of stored data and each bit cell of another subset of the bit cells is used to store a corresponding bit of ECC information.

During an access to the memory location 210, a read voltage is applied to the control electrode of each of the plurality of bit cells of the memory location 210 and each of the sense amplifiers compares the resulting drain current of the corresponding bit cell with the read reference 128. In the event that the drain current of the bit cell is greater than the read reference 128, the output of the sense amplifier therefore is asserted as a logic "1" so as to indicate the sensing of a logic "1" stored at the corresponding bit cell. Conversely, in the event that the drain current of the bit cell is not greater than the read reference 128 the output of the sense amplifier therefore is asserted as a logic "0" so as to indicate the sensing of a logic "0" stored at the corresponding bit cell. The sensed value for each of the bits of the data[0:n] value and the ECC[0:m] is based on the relationship between the drain current of the corresponding bit cell and the read reference 128.

Figure 3:
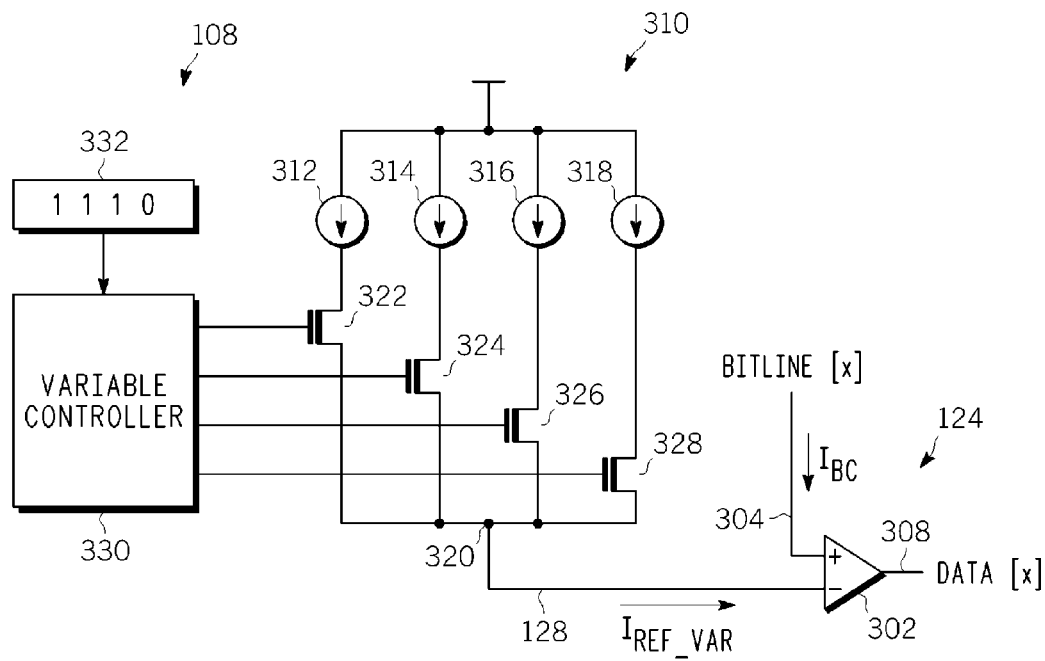
FIG. 3 is a circuit diagram illustrating an adjustable read reference configuration in accordance with at least one embodiment of the present disclosure.
Figure 4:
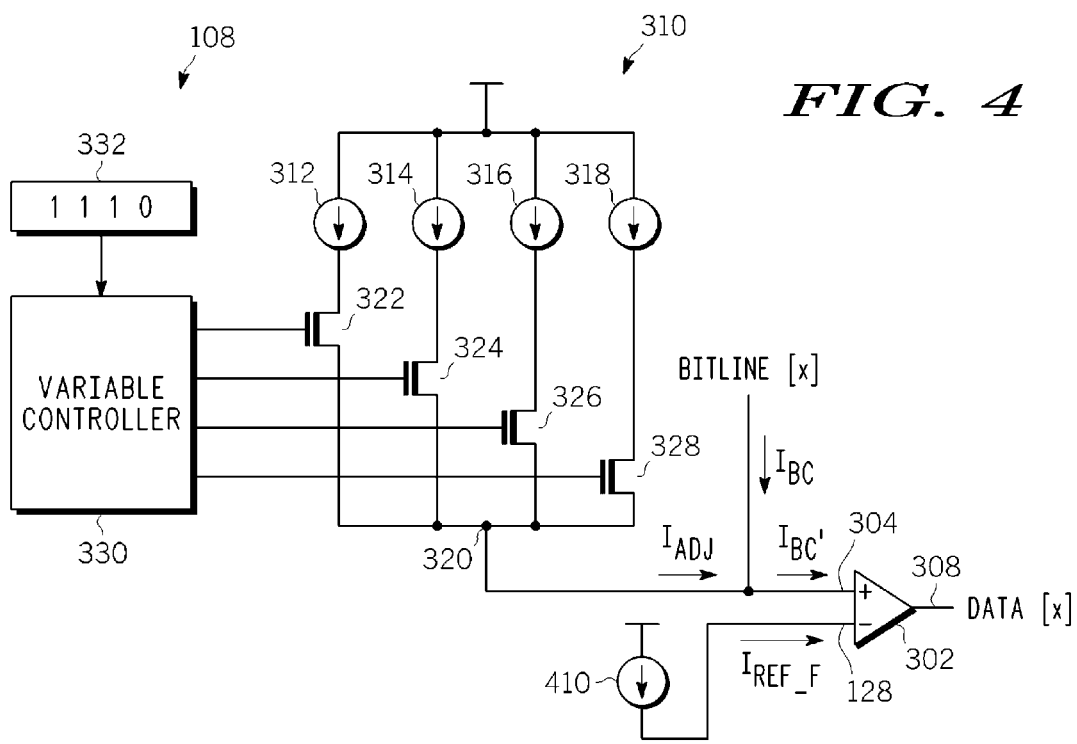
FIG. 4 is a circuit diagram illustrating another adjustable read reference configuration in accordance with at least one embodiment of the present disclosure.

FIGS. 3 and 4 illustrate various implementations of the adjustable read reference generator 108 and the sense amplifier module 124 of FIG. 1 with respect to a bit line in accordance with at least one embodiment of the present disclosure. As depicted by both FIG. 3 and FIG. 4, the sense amplifier module 124 can include a sense amplifier 302 associated with a particular bit line (bit line[x]), whereby the sense amplifier 302 includes a first input configured to receive a bit cell current 304 (current $I_{BC}$) based on the current output by a bit cell being sensed via the bit line[x], a second input configured to receive a current representative of the read reference 128, and an output to provide a signal 308 representative of the value of bit x of a data value (data[x]) based on the relationship between the bit cell current 304 and the current representative of the read reference 128.

In the example of FIG. 3, the adjustable read reference generator 108 supplies an adjustable current (current $I_{REF\_VAR}$) as the read reference 128. The adjustable read reference generator 108 includes a variable current source 310 and a variable controller 330. The variable current source 310 includes a plurality of current sources, such as current sources 312, 314, 316, and 318, each current source connected to a common node 320 via a corresponding transistor, such as transistors 322, 324, 326, and 328. The common node 320 in turn is connected to the second input of the sense amplifier 302, such as via a current mirror (not shown). The variable controller 330 includes an input configured to receive or access a read reference indicator 332 from a corresponding location of the read reference level storage 110 (FIG. 1). Based on the read reference indicator 332, the variable controller 330 is configured to enable or disable the transistors 322, 324, 326, and 328 such that aggregate current supplied to the common node 320 is substantially equivalent to the read reference level represented by the read reference indicator 332.

In the example of FIG. 4, a current source 410 supplies a fixed current ($I_{REF\_F}$) as the read reference 128 and the adjustable read reference generator 108 supplies an adjustable current $I_{ADJ}$. The common node 320 is coupled to the first input of the sense amplifier 302 such that the sense amplifier 302 provides the signal 308 representative of the value of data[x] based on the relationship between the fixed current ($I_{REF\_F}$) and a current $I_{BC'}$ that is the aggregate of the adjustable current $I_{ADJ}$ and the bit cell current $I_{BC}$. In this instance, the read reference indicator 332, rather than representing the current level to be supplied as the read reference 128, instead represents the current level to be used to augment the bit cell current $I_{BC}$ relative to the fixed read current $I_{REF\_F}$ representative of the read reference 128.

As will be appreciated, the bit value output by the sense amplifier 302 is based on the relationship between the current received at the first input of the sense amplifier 302 and the current received at the second input of the sense amplifier 302. In the example of FIG. 3, this relationship can be adjusted by adjusting the current received at the second input of the sense amplifier 302, and in the example of FIG. 4, this relationship can be adjusted by adjusting the current received at the first input of the sense amplifier 302 by bolstering the bit cell current $I_{BC}$ with an adjustable current. Thus, assuming the adjustable read reference generator 108 provides the same output current at the common node 320 in both the implementation of FIG. 3 and FIG. 4, in both implementations the relationship between the current at the first input and the current at the second input of sense amplifier 302 is the same. That is, an increase in the adjustable reference current $I_{REF\_VAR}$ by 2 uA in the implementation of FIG. 3 would have the same effect as the supplementation of the bit cell current $I_{BC}$ by 2 uA (as the adjustable current $I_{ADJ}$) in the implementation of FIG. 4. Thus, the read reference for a given sector as described herein can refer to ether the read reference current supplied to one input of a sense amplifier as in FIG. 3, or to the read reference current supplied to one input of the sense amplifier in addition to the bolster current combined with the bit cell current at the other input of the sense amplifier as in FIG. 4.

Figure 5:
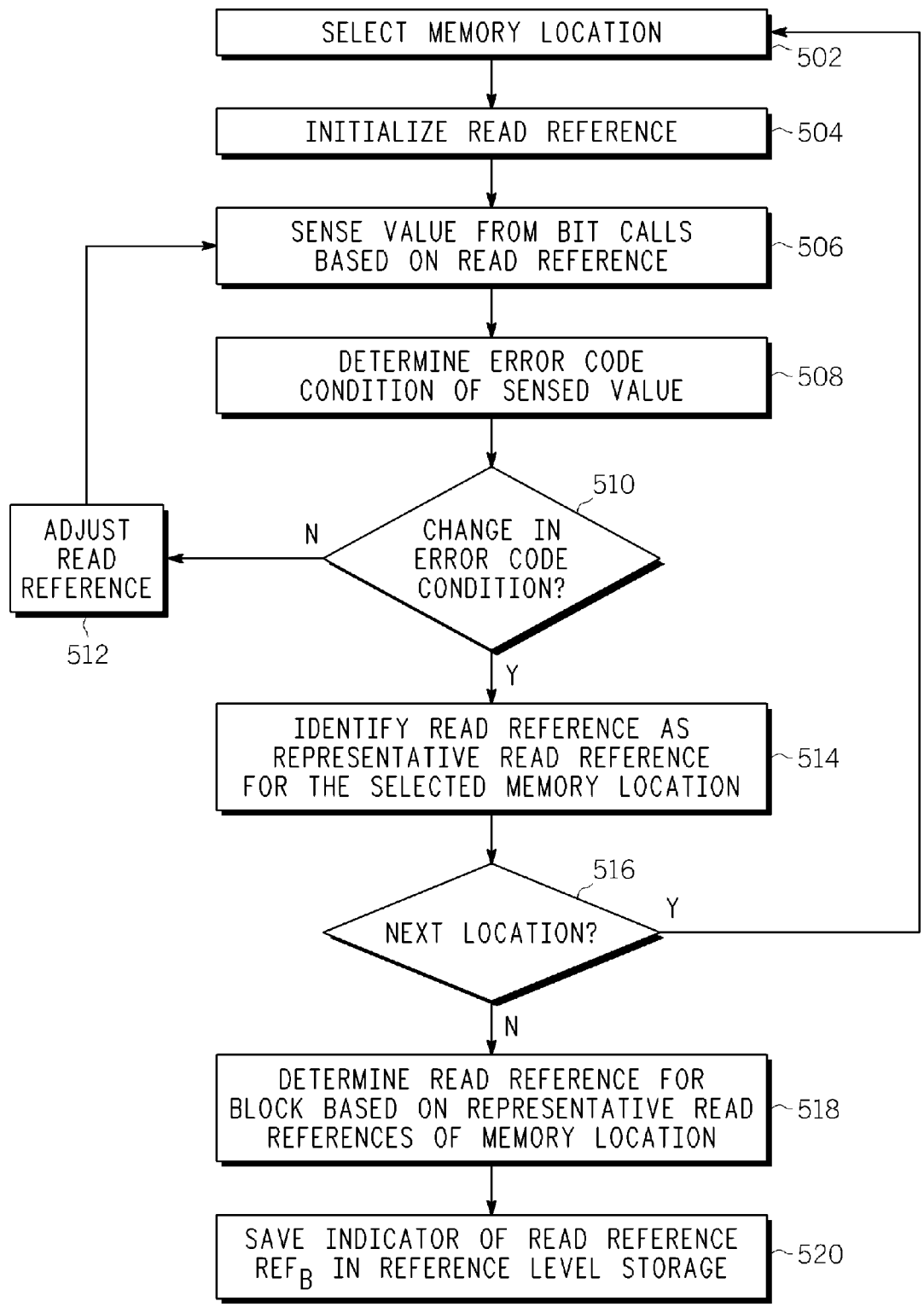
FIG. 5 is a flow diagram illustrating a method for determining a read reference based on an error correcting code (ECC) operation in accordance with at least one embodiment of the present disclosure.

FIG. 5 illustrates a flow diagram 500 for determining the read reference for a sector of a NVM array based on an error code condition change in accordance with at least one embodiment of the present disclosure. For ease of illustration, the flow diagram 500 is described in the example context of the NVM device 100 of FIG. 1.

In one embodiment, the flow diagram 500 initiates in response to a program operation or an erase operation to the sector, or in response to a reset event for the NVM device 100. At block 502, a memory location from a sample set of memory locations of the sector is selected. In one embodiment, a representation of the sample set is stored at the address sequencer 106, which selects the next memory location and provides the corresponding ADDR signal 126 in response to the address control signal 140 provided by the state machine 112. At block 504, the state machine 112 initializes the adjustable read reference generator 108 to provide an initial level for the read reference 128. For ease of illustration, it is assumed for the description of FIG. 5 that the read reference 128 is set to a relatively high level and then decremented.

At block 506, the sense amplifier module 124 senses a value from the set of bit cells at the selected memory location using the read reference 128. As described above, the sensed value, or bit sequence, includes data bits and ECC bits. At block 508, the ECC decoder 104 performs an ECC operation to determine the error code condition for the sensed value and the state machine 112 stores an indicator of the determined error code condition in, for example, a register. At block 510, the state machine 112 determines whether a sufficient change in the error code condition has occurred between the current iteration and the previous iteration. In one embodiment, any change in the error code condition may be a sufficient change. However, as noted above, in certain instances it may be advantageous to minimize the interference caused by non-operational bit cells and therefore the sufficient change in the error code condition may be a predetermined change, such as from a multiple bit error code condition to a no bit error code condition, or from a no bit error code condition to a multiple bit error code condition.

If no change (or an insufficient change) has occurred in the error code condition between the current iteration and the previous iteration (or if it is the initial error code condition), the flow diagram 500 moves to block 512, whereby the read reference 128 is adjusted (decremented in this example) and the process of blocks 506, 508, and 510 is repeated using the adjusted read reference 128.

If a sufficient change has occurred in the error code condition between the current iteration and the previous iteration, the flow diagram 500 moves to block 514 whereby the state machine 112 identifies the current level of the read reference 128 as the representative read reference for the selected memory location. At block 516, the state machine 112 determines whether there is another memory location of the sample set to be analyzed. If so, the flow diagram 500 returns to block 502, whereby the next memory location of the sample set is selected and the process of blocks 504, 506, 508, 510, 512, 514, and 516 is repeated to determine the representative read reference for the next selected memory location.

After a set of representative read references has been determined for the memory locations of the sample set, the flow diagram 500 moves to block 518, whereby the state machine 112 determines the read reference for the sector based on the set of representative read references. In instances whereby the representative read references for the memory locations are determined based on the drain current distribution of erased bits of the memory location, the state machine 112 can determine the read reference for the sector based on the minimum representative read reference from the set of representative read references. To illustrate, the state machine 112 can determine the read reference for the sector by applying an adjustment factor (less than 1) to the minimum representative read reference or by selecting a reference level at or below a predetermined offset below the minimum representative read reference of the set of representative read references. In instances whereby the representative read references for the memory locations are determined based on the drain current distribution of programmed bits of the memory location, the state machine 112 can determine the read reference for the sector based on the maximum representative read reference from the set of representative read references. To illustrate, the state machine 112 can determine the read reference for the sector by applying an adjustment factor (greater than 1) to the maximum representative read reference or by selecting a reference level at or above a predetermined offset above the maximum representative read reference of the set of representative read references. Other techniques for determining the read reference for the sector based on the representative read references of the memory locations of the sample set can be used without departing from the scope of the present disclosure. For example, the read reference for the sector can be determined based on an averaging of the representative read references.

At block 520, the state machine 112 stores an indicator of the read reference for the sector in a corresponding storage location of the read reference level storage 110. In one embodiment, the read reference level storage 110 comprises non-volatile memory such that the read references for the sectors of the NVM array 102 can be retained when the NVM device 100 is powered down. It will be appreciated that due to the trap-up characteristics of the bit cells of the NVM array 102, it is unlikely that the read reference for a sector will increase over time. Accordingly, in one embodiment, the stored indicator may be formatted such that the adjustment of the read reference for a sector from one level to another level requires programming only a single bit.

Figure 6:
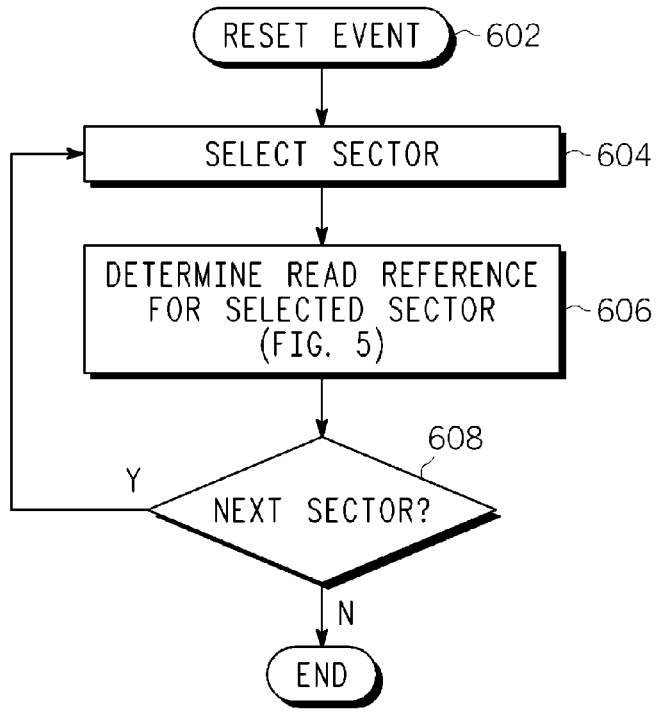
FIG. 6 is a flow diagram illustrating a method for determining a read reference on a sector-by-sector basis in response to a reset event in accordance with at least one embodiment of the present disclosure.

FIG. 6 illustrates a flow diagram 600 for determining the read reference for some or all of the sectors of a NVM array in response to a reset event in accordance with at least one embodiment of the present disclosure. For ease of illustration, the flow diagram 600 is described in the example context of the NVM device 100 of FIG. 1.

At block 602, a reset event occurs for the NVM device 100. In response to the reset event, the state machine 112 selects a sector of the NVM array 102 at block 604 and the read reference for the selected sector is determined at block 606 as described with reference to the flow diagram 500 of FIG. 5. At block 608, the state machine 112 determines whether there is another sector to analyze. If so, the state machine 112 selects the next sector at block 604 and the read reference for the next sector is determined at block 606. Otherwise, if no unanalyzed sectors remain, the flow diagram 600 ends.

Figure 7:
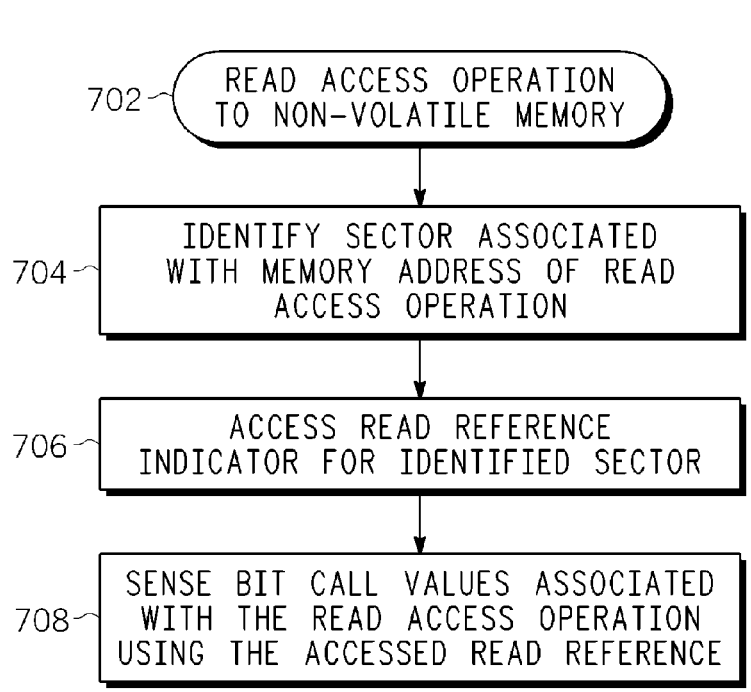
FIG. 7 is a flow diagram illustrating a method for configuring a read reference for sensing a data value in a non-volatile memory device in accordance with at least one embodiment of the preset disclosure.

FIG. 7 illustrates a flow diagram 700 for performing a read access to a memory location of a NVM array in accordance with at least one embodiment of the present disclosure. For ease of illustration, the flow diagram 700 is described in the example context of the NVM device 100 of FIG. 1.

At block 702, a read access operation is provided to the NVM device 100 for processing. In response to the read access operation, the state machine 112 identifies the sector associated with the memory address of the read access operation at block 704. At block 706, the state machine 112 accesses the read reference indicator for the identified sector. In one embodiment, the indicator is accessed directly from the read reference level storage 110. In another embodiment, copies of some or all of the indicators stored in the read reference level storage 110 are temporarily stored in a register file at device start-up and the state machine 112 therefore accesses the indicator from the register file. At block 708, the state machine 112 configures the adjustable read reference generator 108 to output a level for the read reference 128 substantially equivalent to the level identified by the read reference indicator and the sense amplifier module 124 senses a bit sequence from the bit cells of the memory location of the sector identified by the memory address. The bit sequence then is processed by the ECC decoder 104 and the resulting data value is provided to the bus 114 for transfer to the requesting device.

Figure 8:
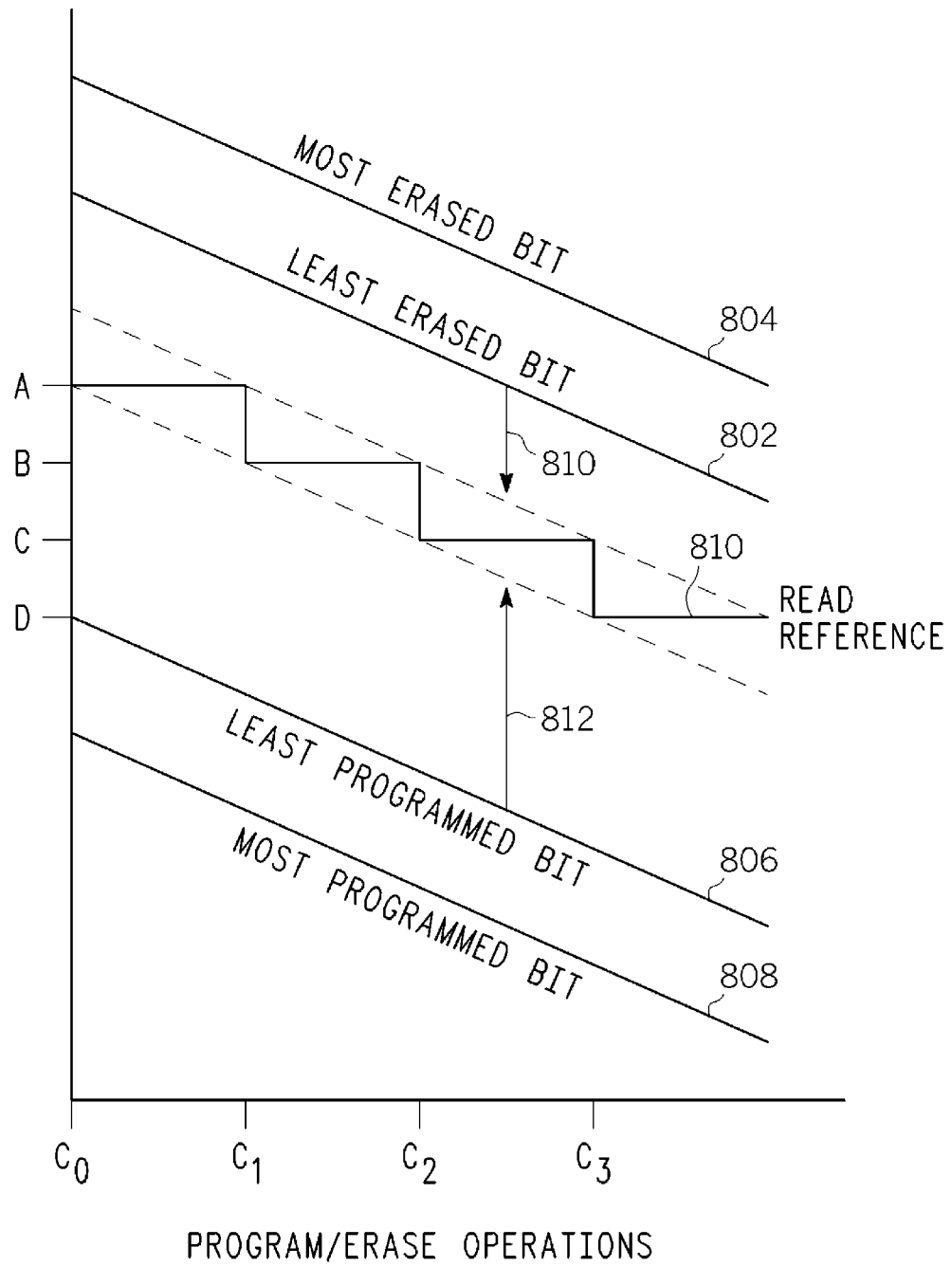
FIG. 8 is a chart illustrating a configuration of an adjustable read reference for a corresponding sector in accordance with at least one embodiment of the present disclosure.

FIG. 8 illustrates a chart 800 depicting an example configuration of a read reference for a sector of a NVM array in accordance with at least one embodiment of the present disclosure. The ordinate of chart 800 represents current (I) and the abscissa represents the number of program/erase operations to the sector. Line 802 represents the drain current of the least erased bit cell of the sector, line 804 represents the drain current of the most erased bit cell of the sector, line 806 represents the drain current of the least programmed bit cell of the sector, line 808 represents the drain current of the most programmed bit cell of the sector, and line 810 represents an example read reference current based on the drain current of the least erased bit cell (line 802) and/or the drain current of the least programmed bit cell (line 806). As the downward slope of lines 802, 804, 806 and 808 suggests, the drain current of the bit cells of the sector decreases as the number of program/erase operations increases due to the trap-up characteristic of the bit cells of the NVM array.

In order to facilitate accurate sensing of the bit value stored by a bit cell of the NVM array the read reference typically is configured so as to be less than the drain current of the least erased bit cell (line 802) and greater than the drain current of the least programmed bit cell (line 806) so that erased bit cells are corrected sensed as erased and programmed bit cells are correctly sensed as programmed. It therefore will be appreciated that the region between lines 802 and 806 represents the read reference current for which the bit cells of the sector are likely to be correctly sensed. Accordingly, the read reference for the sector can be determined by selecting a level less than the drain current of the least erased bit cell (line 802) by a predetermined offset 810 or a level greater than the drain current of the least programmed bit cell (line 806) by a predetermined offset 812, where the offsets 810 and 812 can be fixed or variable. To illustrate, assuming there are four read reference levels, A, B, C, D: for the period between $C_0$ and $C_1$, the read reference for the sector can be set to level A; for the period between $C_1$ and $C_2$, the read reference for the sector can be set to level B; for the period between C2 and C3, the read reference for the sector can be set to level C; and for the period after $C_3$, the read reference for the sector can be set to level D, thereby maintaining the offsets 810 and 812.

The preceding description is intended to convey a thorough understanding of the present disclosure by providing a number of specific embodiments and details involving adjusting the read reference for a non-volatile memory. It is understood, however, that the present disclosure is not limited to these specific embodiments and details, which are exemplary only, and the scope of the disclosure is accordingly intended to be limited only by the following claims and equivalents thereof. It is further understood that one possessing ordinary skill in the art, in light of known systems and methods, would appreciate the use of the present disclosure for its intended purposes and benefits in any number of alternative embodiments, depending upon specific design and other needs.

In this document, relational terms such as "first" and "second", and the like, may be used solely to distinguish one entity or action from another entity or action without necessarily requiring or implying any actual such relationship or order between such entities or actions. The terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

The term "another", as used herein, is defined as at least a second or more. The terms "including", "having", or any variation thereof, as used herein, are defined as comprising. The term "coupled", as used herein with reference to electro-optical technology, is defined as connected, although not necessarily directly, and not necessarily mechanically.

What is claimed is:

1. A method comprising:
sensing a first value from a first set of bit cells of a sector of a non-volatile memory device based on a first read reference;
sensing a second value from the first set of bit cells based on a second read reference different than the first read reference; and
determining a third read reference for a first subsequent access to the sector of the non-volatile memory device based on at least one of the first read reference and the second read reference in response to determining a first error code condition associated with the first value and a second error code condition associated with the second value representing different error code conditions.

2. The method of claim 1, wherein:
the first read reference is less than the second read reference; and
determining the third read reference comprises determining the third read reference in response to determining the first error code condition indicates an error condition for the first data value and the second error code condition indicates a non-error condition for the second data value.

3. The method of claim 2, wherein the error code condition comprises one of: a single bit error or a double bit error.

4. The method of claim 1, wherein:
the first read reference is greater than the second read reference; and
determining the third read reference comprises determining the third read reference in response to determining the first error code condition indicates a non-error condition for the first data value and the second error code condition indicates an error condition for the second data value.

5. The method of claim 1, further comprising:
sensing a third value from the first set of bit cells based on a fourth read reference different than the first read reference and the second read reference; and
determining a fifth read reference for a second subsequent access to the sector based on at least one of the second read reference and the fourth read reference in response to determining a third error code condition associated with the third value and the second error code condition represent different error code conditions.

6. The method of claim 1, further comprising:
sensing a third value from a second set of bit cells of the sector based on a fourth read reference;
sensing a fourth value from the second set of bit cells based on a fifth read reference different than the fourth read reference; and
determining the third read reference further based on at least one of the fourth read reference and the fifth read reference in response to determining that a third error code condition associated with the third value and a fourth error code condition associated with the fourth value represent different error code conditions.

7. The method of claim 1, wherein:
sensing the first value and sensing the second value comprise sensing the first value and sensing the second value in response to one of: an erase operation for the sector; a program operation for the sector; and a reset operation.

8. The method of claim 1, further comprising:
sensing a third value from the first set of bit cells based on the third read reference during the first subsequent access to the sector.

9. The method of claim 8, further comprising:
storing an indicator of the third reference level in a non-volatile storage location; and
wherein sensing the third value comprises:
  accessing the indicator of the third read reference from the non-volatile storage location;
  configuring a read reference generator to provide an output read reference substantially equivalent to the third read reference based on the indicator of the third read reference; and
  sensing the third value based on the output read reference.

10. The method of claim 1, wherein determining the third read reference comprises adjusting one of the first read reference or the second read reference by an offset to generate the third read reference.

11. A method comprising:
for each set of bit cells of a plurality of sets of bit cells of a sector of a non-volatile memory device:
  adjusting a read reference level and sensing a value of the set of bit cells based on the adjusted read reference level until a change in an error code condition of the set of bit cells is detected; and
  identifying a read reference level at which the change in the error code condition was detected as a representative read reference for the set of bit cells; and
determining a first read reference for a first subsequent access to the sector based on the representative read references for the plurality of sets of bit cells.

12. The method of claim 11, wherein adjusting the read reference level comprises increasing the read reference level and wherein the change in the error code condition comprises a change from a non-error condition to an error condition.

13. The method of claim 11, wherein adjusting the read reference level comprises decreasing the read reference level and wherein the change in the error code condition comprises a change from an error condition to a non-error condition.

14. The method of claim 11, wherein determining the first read reference comprises:
determining a maximum read reference of the representative read references; and
determining the first read reference based on the maximum read reference and an offset.

15. The method of claim 11, wherein determining the first read reference comprises:
determining a minimum read reference of the representative read references; and
determining the first read reference based on the minimum read reference and an offset.

16. A device comprising:
a non-volatile memory array comprising a plurality of sectors, each sector having a plurality of sets of bit cells;
a read reference generator having an output to provide an adjustable read reference;
a sense amplifier module comprising an input selectively coupleable to a select set of bit cells of a select sector of the non-volatile memory array, an input coupled to the output of the read reference generator, and an output to provide a sensed value from the select set of bit cells based on the adjustable read reference;
an error correcting code (ECC) module having an input coupled to the output of the sense amplifier module and an output to provide an error code condition based on the sensed value; and
a state machine having an input coupled to the output of the ECC module, a control output coupled to the read reference generator, the state machine configured to determine a read reference for a subsequent access to the select sector of the non-volatile memory array in response to a change in the error code condition output by the ECC module resulting from a change in the adjustable read reference.

17. The device of claim 16, further comprising:
non-volatile storage to store an indicator of the read reference; and
wherein the state machine is configured to access the non-volatile storage to access the indicator of the read reference.

18. The device of claim 16, wherein the state machine is configured to determine the read reference for a subsequent access to the select sector of the non-volatile memory array in response to a memory operation.

19. The device of claim 16, wherein the state machine is configured to determine the read reference for the subsequent access to the select sector based on the adjustable read reference and an offset.

20. The device of claim 16, wherein the bit cells of the non-volatile memory array comprise thin-film storage bit cells.

* * * * *